United States Patent
Chen et al.

(10) Patent No.: US 9,638,972 B2
(45) Date of Patent: May 2, 2017

(54) ARRAY SUBSTRATE, MANUFACTURING METHOD THEREOF AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Xi Chen, Beijing (CN); Yuchun Feng, Beijing (CN); Jianfeng Yuan, Beijing (CN); Linlin Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 482 days.

(21) Appl. No.: 14/354,186

(22) PCT Filed: Dec. 3, 2013

(86) PCT No.: PCT/CN2013/088457
§ 371 (c)(1),
(2) Date: Apr. 25, 2014

(87) PCT Pub. No.: WO2014/183420
PCT Pub. Date: Nov. 20, 2014

(65) Prior Publication Data
US 2016/0349584 A1     Dec. 1, 2016

(30) Foreign Application Priority Data
May 17, 2013   (CN) .......................... 2013 1 0184908

(51) Int. Cl.
*G02F 1/1362*     (2006.01)
*G02F 1/1368*     (2006.01)
*H01L 27/12*      (2006.01)

(52) U.S. Cl.
CPC ...... *G02F 1/136259* (2013.01); *G02F 1/1368* (2013.01); *G02F 1/136286* (2013.01);
(Continued)

(58) Field of Classification Search
CPC ............... H01L 27/1244; H01L 27/124; G02F 1/136286; G02F 2001/136263;
(Continued)

(56) References Cited

U.S. PATENT DOCUMENTS

| 2009/0085034 | A1  | 4/2009 | Choi et al. |
| 2010/0155735 | A1* | 6/2010 | Park ........................ G02F 1/167 257/71 |
| 2012/0099043 | A1* | 4/2012 | Sun .................... H01L 29/41733 349/43 |

FOREIGN PATENT DOCUMENTS

| CN | 101399272 A | 4/2009 |
| CN | 101826488 A | 9/2010 |

(Continued)

OTHER PUBLICATIONS

International Search Report mailed Feb. 20, 2014; PCT/CN2013/088457.
(Continued)

*Primary Examiner* — Thomas L Dickey
*Assistant Examiner* — Changhyun Yi
(74) *Attorney, Agent, or Firm* — Ladas & Parry LLP

(57) ABSTRACT

An array substrate, a manufacturing method thereof and a display panel are disclosed. The array substrate includes: a base substrate, gate scanning lines, a gate-insulating layer, an active layer, data lines, a passivation layer, and pixel electrodes; the array substrate further includes: a bridge structure and a connection line corresponding to each data line; the bridge structure is located on the passivation layer and is provided in a same layer as the pixel electrodes; each (Continued)

connection line is located on the base substrate and is connected with the data line, through the bridge structure in an LED region and in a region under a scribe line of a counter substrate. Therefore the problem of defective display caused by breakage of data lines can be solved, and the display effect of a liquid crystal display device can be improved.

20 Claims, 5 Drawing Sheets

(52) U.S. Cl.
CPC ........ *H01L 27/124* (2013.01); *H01L 27/1244* (2013.01); *G02F 2001/136263* (2013.01)

(58) Field of Classification Search
CPC ............. G02F 1/1368; G02F 1/136259; G02F 2201/50; G02F 1/134336; G02F 1/136209; G02F 2201/40; G02F 1/133345; G02F 2001/136222
USPC ........................ 349/43, 139; 257/43; 438/104
See application file for complete search history.

(56) References Cited

FOREIGN PATENT DOCUMENTS

| | | |
|---|---|---|
| CN | 102213879 A | 10/2011 |
| CN | 103293807 A | 9/2013 |

OTHER PUBLICATIONS

First Chinese Office Action dated Feb. 20, 2014; Appln. No. 201310184908.8.
Second Chinese Office Action Appln. No. 201310184908,8; Dated Oct. 8, 2014.
Chinese Rejection Decision Appln. No. 201310184908.8; Dated Feb. 4, 2015.
Written Opinion of the International Searching Authority mailed Feb. 20, 2014; PCT/CN2013/088457.

\* cited by examiner

ARRAY SUBSTRATE, MANUFACTURING METHOD THEREOF AND DISPLAY PANEL

TECHNICAL FIELD

Embodiments of the invention relate to the technical field of liquid crystal display, and more particularly, to an array substrate, a manufacturing method thereof, and a display panel.

BACKGROUND

With the development of thin-film-transistor liquid crystal display technology and the advancement of industrial technologies, liquid crystal display technology has replaced cathode-ray tube display technology and become a mainstream technology in the display field of daily life. A liquid crystal display device, by virtue of its lowered production costs, increasingly improved manufacturing processes and advantages of its own, becomes an ideal display device in minds of consumers as well as in the market. Currently, stereoscopic display technology is becoming popular in the market, and therefore it is gradually important to solve the technical shortcomings of stereoscopic display technology, so as to improve image quality (e.g., to reduce color shift, reduce bright points and bright lines, reduce stereo crosstalk and screen flicker, and increase viewing angle, etc.).

A thin-film-transistor liquid crystal display (TFT-LCD) comprises: an array substrate, a counter substrate, and a liquid crystal layer located between the array substrate and the counter substrate. The array substrate is provided therein with gate scanning lines and data lines intersecting each other; the gate scanning lines and the data lines are used to transmit scan driving signals and image data signals, respectively, to achieve control of the deflection of liquid crystal molecules, and further achieve control of the intensity of light, and thus achieve image display under a cooperative action of the counter substrate.

In LCD manufacturing processes, a relatively large piece of panel containing an array substrate 1 and a counter substrate 2 needs to be diced at certain positions specified thereon, to form individual liquid crystal cells; in order to uncover a PAD region 101 on the array substrate 1, a corresponding region on the counter substrate 2 needs to be cut off. As illustrated in FIG. 1 and FIG. 2, the array substrate 1 and the counter substrate 2 are cut along a scribe line A, forming separated liquid crystal cells; then, the counter substrate 2 is cut along a scribe line B of the counter substrate 2, to uncover the PAD region 101 of the array substrate 1.

At present, as illustrated in FIG. 2, above the data lines 4 on the array substrate 1, there is usually provided an insulating layer 5 in design. During transferring and breaking in the cutting process, the material cut off from the counter substrate may cause direct damages to the data lines 4 in the PAD region 101 and near the scribe line B of the counter substrate; or, in the production process, damages may occur in the insulating layer 5, and subsequent corrosion or oxidation onto the data lines 4 are invoked. In addition, the materials which can be used for the insulating layer 5 have relatively low adhesion and hardness, and thus are easy to detach under impact of an external force, causing an electrically conductive layer to be exposed; the insulating layer 5 is easy to be damaged or to even detach under impact of an external force and therefore provides relatively poor protection to the data lines 4. Meanwhile, scratching, detachment and damages of the insulating layer 5 are also potential factors which may affect the quality of products; as time passes, detachment and damages of the insulating layer 5 are likely to cause defects to the electrically conductive layer, such as corrosion, thus affecting the quality of products. In actual production, there are precedent cases of product abandonment caused by damage of insulating layer.

As illustrated in FIG. 3, the PAD region may comprise: a lead region (LED region), which is far from the scribe line B of the counter substrate and less prone to cause breakage of data lines, and a region 102, which is near the scribe line B of the counter substrate and prone to cause breakage. In order to solve the breakage problem of data lines, in the prior art, a protective layer 103 is generally provided above the wirings at both sides of the scribe line B of the counter substrate, to reduce damages, which are caused by the material cut off from the counter substrate, to the insulating layer and the data lines during transferring and breaking in the cutting process, thus protecting the wirings and decreasing potentials of product abandonment. However, such scheme can only serve to prevent the breakage of data lines in advance; once the breakage of data lines occurs, the scheme can not solve the problem of defective display caused by the breakage of data lines.

SUMMARY

The embodiments of the invention provide an array substrate, a manufacturing method thereof and a display panel, for solving the problem of defective display in the prior art caused by breakage of data lines, thereby improving screen quality of the liquid crystal panel.

An embodiment of the invention provides an array substrate, and the array substrate comprises: a base substrate, gate scanning lines located on the base substrate, a gate-insulating layer located on the gate scanning lines, an active layer located on the gate-insulating layer, data lines located on the active layer, a passivation layer located over the data lines, pixel electrodes located on the passivation layer; the array substrate further comprises: a bridge structure and a connection line corresponding to each data line; wherein the bridge structure is located on the passivation layer, and is provided in a same layer as the pixel electrodes; each connection line is located on the base substrate, and is connected with the data line, through the bridge structure in an LED region and in a region under a scribe line of a counter substrate.

For example, the connection line and the gate scanning lines are provided in a same layer but not intersect.

For example, the connection line and the gate scanning lines are mutually perpendicular.

For example, the connection line and the gate scanning lines are manufactured from a same material.

For example, the coverage of the connection line and the coverage of the data line do not overlap.

For example, the bridge structure is connected with the data line, through a first-type via-hole which penetrates the passivation layer and is located over the data line.

For example, the bridge structure is connected with the connection line, through a second-type via-hole which penetrates the passivation layer, the active layer and the gate-insulating layer and is located over the connection line.

An embodiment of the invention provides a display panel, and the display panel comprises an array substrate as described above.

An embodiment of the invention provides a manufacturing method of an array substrate as described above, and the method comprises steps as follows: forming gate scanning lines on a base substrate; forming a gate-insulating layer on the gate scanning lines; forming an active layer on the gate-insulating layer; forming data lines on the active layer; forming a passivation layer on the data lines; and forming pixel electrodes on the passivation layer; the method further comprises steps as follows: forming a connection line corresponding to each data line above the base substrate, and the connection line being connected with the data line, through a bridge structure in an LED region and in a region under a scribe line of a counter substrate; and forming a bridge structure on the passivation layer, and the bridge structure being provided in a same layer as the pixel electrodes.

The array substrate provided by the embodiment of the invention comprises: data lines, a bridge structure and a connection line corresponding to each data line; wherein the bridge structure is located on the passivation layer, and is provided in a same layer as the pixel electrodes, moreover, the bridge structure connects both the data line and the corresponding connection line in an LED region and in a region under a scribe line of a counter substrate; each connection line is located on the base substrate, and is connected with the data line, through the bridge structure in an LED region and in a region under a scribe line of a counter substrate, so that, when breakage occurs to the data lines located between an LED region and a scribe line of a counter substrate, image data signals can be continually transmitted through the connection lines, which can effectively solve the problem of defective display caused by breakage of the data lines, thereby improving the quality of the screen display, enhancing the display effect of a liquid crystal display device, and improving the user experience.

DETAILED DESCRIPTION

Figure 1:
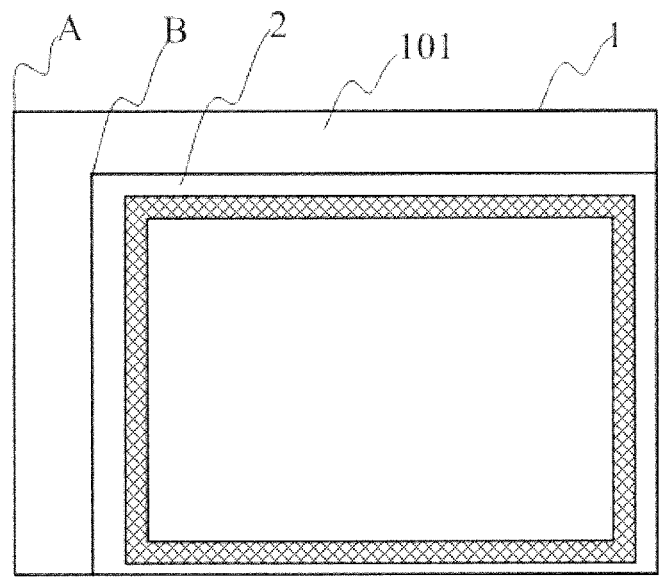
FIG. 1 is a plan view of a display panel in the prior art.

The embodiments of the invention provide an array substrate, a manufacturing method thereof and a display panel, for solving the problem of defective display, which is caused by breakage of data lines, thereby improving the display effect of the liquid crystal display device.

An embodiment of the invention provides an array substrate, and the array substrate comprises: a base substrate, gate scanning lines located on the base substrate, a gate-insulating layer located on the gate scanning lines, an active layer located on the gate-insulating layer, data lines located on the active layer, a passivation layer located over the data lines, and pixel electrodes located on the passivation layer. The array substrate further comprises: a bridge structure and a connection line corresponding to each data line.

The bridge structure is located on the passivation layer, and is provided in a same layer as the pixel electrodes;

Each connection line is located on the base substrate, and is connected with the data line, through the bridge structure in an LED region and in a region under a scribe line of a counter substrate.

For example, the bridge structure is connected with the data line, through a first-type via-hole penetrating the passivation layer and located over the data line; and the bridge structure is connected with the connection line, through a second-type via-hole penetrating the passivation layer, the active layer and the gate-insulating layer and located over the connection line.

The bridge structures are provided in a same layer as the pixel electrodes; for example, in order to simplify the manufacturing processes, the bridge structures and the pixel electrodes are manufactured from a same electrically conductive material, typically indium-tin oxide (ITO); in addition, the bridge structures also may be manufactured from other electrically conductive materials.

For example, the connection lines are located on the base substrate, and are provided in a same layer as the gate scanning lines; moreover, the connection lines and the gate scanning lines are mutually perpendicular but not intersecting; in addition, the connection lines also may be provided in another layer, for example, the connection lines also may be provided in a same layer as the data lines, however, in such a structure, the connection lines are located relatively closer to the surface, and thus breakage may occur during transferring and breaking, therefore, such structure can not satisfactorily solve the problem of defective display caused by breakage of the data lines.

For example, the connection lines are manufactured from an electrically conductive metal material, and may be manufactured from a same material as the gate scanning lines; with a metal material, the electrical resistance of the connection lines can be effectively reduced. Meanwhile, the connection lines also may be manufactured from other electrically conductive materials, such as indium-tin oxide (ITO) and the like; however, ITO has relatively large electrical resistance, which is disadvantageous for the transmission of electrical signals.

For example, the coverage of the connection lines and the coverage of the data lines do not overlap; between the coverage of the connection lines and the coverage of the data lines, there is a certain distance, and the distance remains constant.

Figure 4:
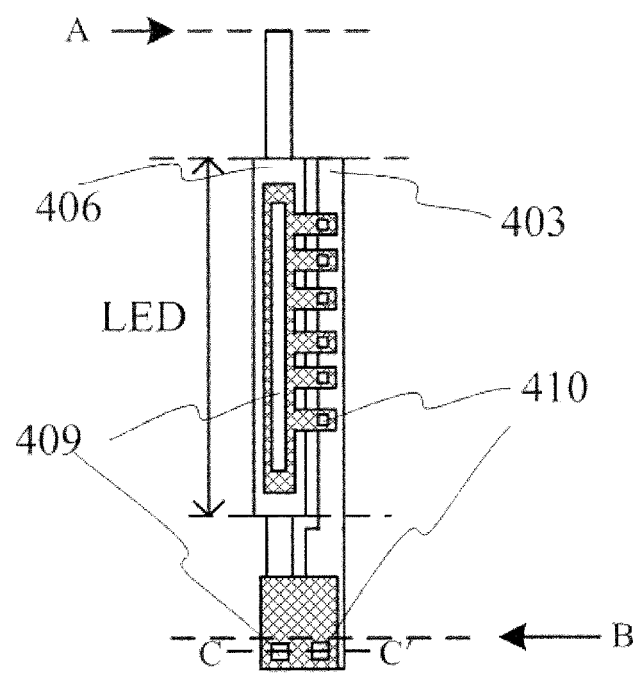
FIG. 4 is a schematic structural plan view of an array substrate provided in an embodiment of the invention.
Figure 5:
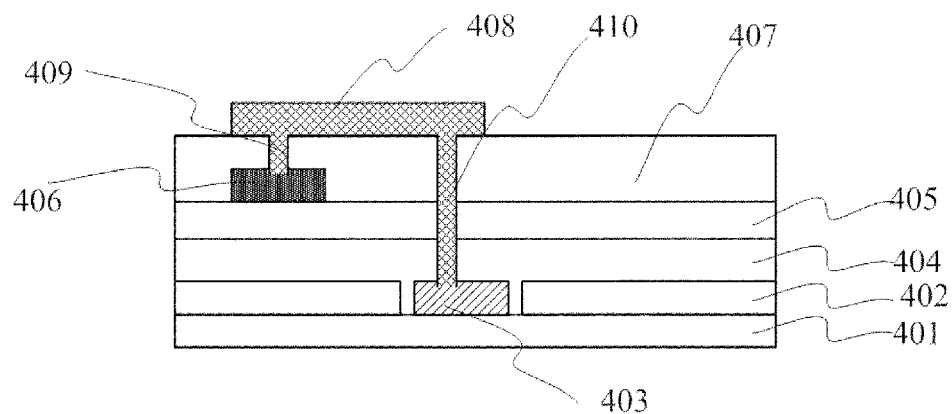
FIG. 5 is a schematic structural sectional view of the array substrate taken along the direction of a dashed line C-C' in FIG. 4.

Below, in connection with the accompanying drawings, the array substrate provided in the embodiment of the invention is described in detail; with reference to FIG. 4 and FIG. 5, FIG. 4 is a plan view of the array substrate provided in the embodiment of the invention, and FIG. 5 is a schematic structural sectional view of the array substrate, taken along the direction of the dashed line C-C' in FIG. 4. With reference to FIG. 4 and FIG. 5, it can be seen that, the array substrate comprises: a base substrate 401, gate scanning lines 402, connection lines 403, a gate-insulating layer 404, an active layer 405, data lines 406, a passivation layer 407, a bridge structure 408, a first-type via-hole 409, and a second-type via-hole 410; in addition, the array substrate further comprises: pixel electrodes (not shown), and the drain electrodes, the gate electrodes and the source electrodes of thin-film transistors connected with the pixel electrodes.

For example, the gate electrodes (not shown) of the thin-film transistors, the gate scanning lines 402 and the connection lines 403 are provided in a same layer, and all are located on the base substrate 401; moreover, the gate electrodes of the thin-film transistors, the gate scanning lines 402 and the connection lines 403 are manufactured from a same material, which is molybdenum (Mo), aluminum (Al), chromium (Cr) or copper (Cu) or other metals.

By using a metal material, the electrical resistance of the connection lines 403 can be effectively reduced; in addition, the connection lines 403 also may be formed of other electrically conductive materials, such as indium-tin oxide (ITO) or the like; however, ITO has a relatively large electrical resistance, which is disadvantageous for the transmission of electrical signals while also increasing the manufacturing processes.

In the array substrate, the connection lines 403 are covered from above by a multi-layer structure, and thus during a subsequent cutting process, the multi-layer structure located above the connection lines 403 can provide protection to the connection lines 403, so that the connection lines 403 will not be broken during transferring and breaking.

The connection lines 403 are provided in such a way that the wiring directions of the connection lines 403 and of the gate scanning lines 402 are mutually perpendicular; moreover, the connection lines 403 and the gate scanning lines 402 are not intersecting.

The gate-insulating layer 404 is located on the gate electrodes of the thin-film transistors, the gate scanning lines 402 and the connection lines 403, and is used to insulate the gate electrodes of the thin-film transistors, the gate scanning lines and the connection lines 403 from other layers, and is manufactured from silicon nitride ($SiN_x$) or silicon oxide ($SiO_x$).

The active layer 405 is located on the gate-insulating layer 404.

The source electrodes (not shown) of the thin-film transistors and the drain electrodes (not shown) of the thin-film transistors are provided in a same layer, and all are located on the active layer 405; the source electrodes and drain electrodes of the thin-film transistors are manufactured from an electrically conductive metal, for example, a monolayer of molybdenum (Mo), chromium (Cr) or a bi-layer of aluminum-niobium alloy/molybdenum (AlNb/Mo) or other metals.

The data lines 406 are located above the active layer 405 and below the passivation layer 407, and the wiring directions of the data lines 406 and of the connection lines 403 are parallel to each other; in order to prevent a height difference, the coverage of the data lines 406 and the coverage of the connection lines 403 do not overlap, and moreover, the distance between a data line 406 and a connection line 403 remains constant; meanwhile, in order to reduce the electrical resistance between the connection lines 403 and the data lines 406, the connection lines 403 and the data lines 406 should be provided as close as better.

The passivation layer 407 is located on the source electrodes and drain electrodes of the thin-film transistors, and is manufactured from a same material as the gate-insulating layer 404, that is, silicon nitride ($SiN_x$) or silicon oxide ($SiO_x$).

The pixel electrodes (not shown) are located on the passivation layer 407, and are directly connected with the drain electrodes of the thin film transistors, through third-type via-holes (not shown) in the passivation layer 407; the pixel electrodes are manufactured from a transparent electrically conductive material, such as indium-tin oxide (ITO) or the like.

The bridge structures 408 are located on the passivation layer 407, and is provided in a same layer as the pixel electrodes; moreover, the bridge structures 408 and the pixel electrodes are manufactured from a same material and by a same process.

The regions for distribution of the pixel electrodes and the bridge structures 408 are different: the pixel electrodes are located in a display region, and are used to drive liquid crystal molecules to deflect so as to achieve image display, whereas the bridge structures 408 are located in a non-display region and above the connection lines 403 and the data lines 406, and are used to connect the data lines 406 and the connection lines 403, through the first-type via-holes 409 and the second-type via-holes 410, respectively.

The first-type via-holes 409 are located over the data lines 406 and penetrating the passivation layer 407, so that the bridge structures 408 are connected with the data lines 406 through the first-type via-holes 409; moreover, at least one first-type via-hole 409 is provided both in the LED region and in the region under the scribe line B of a counter substrate.

The second-type via-holes 410 are located over the connection lines 403 and sequentially penetrating the gate-insulating layer 404, the active layer 405 and the passivation layer 407, so that the bridge structures 408 are connected with the connection lines 403 through the second-type via-holes 410; moreover, at least one second-type via-hole 410 is provided both in the LED region and in the region under the scribe line B of a cell-assembled substrate.

Figure 6:
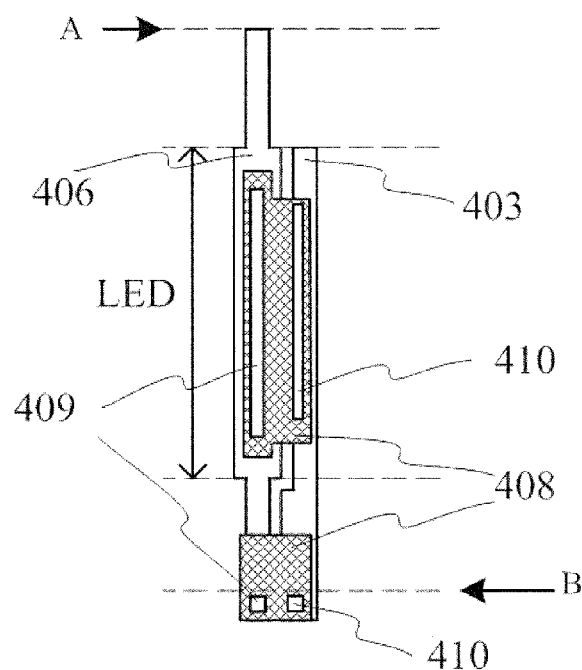
FIG. 6 is a schematic structural plan view of another array substrate provided in an embodiment of the invention.

An embodiment of the invention further provides another array substrate, and its structural plan view is shown in FIG. 6; as can be seen from FIG. 6, this array substrate and the array substrate shown in FIG. 4 are substantially the same in their structures; the difference between the two array substrates lies in the following points: in the array substrate shown in FIG. 4, within an LED region, a plurality of small-diameter second-type via-holes 410 are provided over a connection line 403, so that, within that region, the connection of the data line 406 with the connection line 403 is achieved by the plurality of small-diameter second-type via-holes 410 and the first-type via-hole 409 as well as the bridge structure 408 covering from above; while in the array substrate shown in FIG. 6, within an LED region, one large-diameter second-type via-hole 410 is provided over a connection line, so that, within that region, the connection of the data line 406 with the connection line 403 is achieved by the one large-diameter second-type via-hole 410 and the first-type via-hole 409 as well as the bridge structure 408 covering from above.

A manufacturing method of an array substrate is provided by an embodiment of the invention, and the method comprises steps as follows. Gate scanning lines are manufactured on a base substrate; a gate-insulating layer is manufactured on the gate scanning lines; an active layer is manufactured on the gate-insulating layer; data lines are manufactured above the active layer; a passivation layer is manufactured on the data lines; and pixel electrodes are manufactured on the passivation layer. The method further comprises steps as follows.

A connection line corresponding to each data line is manufactured above the base substrate, and the connection line is to be connected with a data line, through a bridge structure in an LED region and in a region under a scribe line of a counter substrate.

A bridge structure is manufactured above the passivation layer, and the bridge structure is provided in a same layer as the pixel electrodes.

For example, the method further comprises: forming a first-type via-hole penetrating the passivation layer over a data line, so that the bridge structure is connected with the data line through the first-type via-hole; and forming a second-type via-hole penetrating the passivation layer, the active layer and the gate-insulating layer over a connection line, so that the bridge structure is connected with the connection line through the second-type via-hole.

Figure 2:
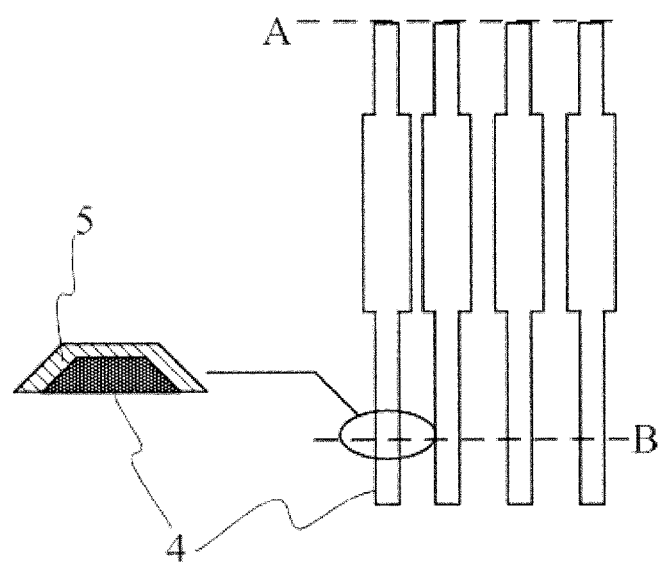
FIG. 2 is a illustrative view of a PAD region on an array substrate of the display panel as illustrated in FIG. 1.
Figure 3:
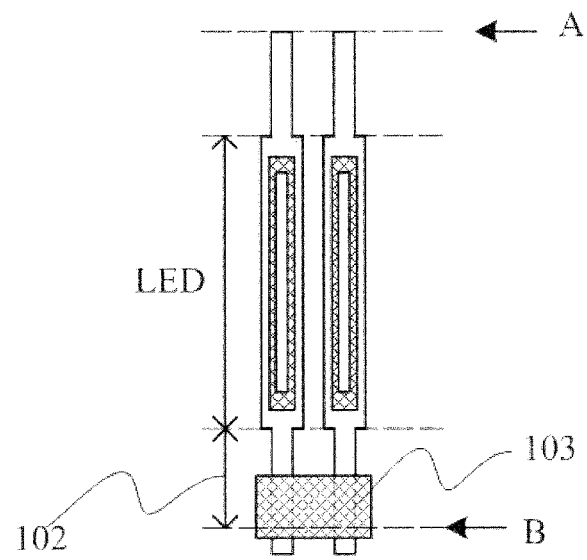
FIG. 3 is a schematic structural plan view of an array substrate in the prior art, for preventing breakage of data lines.
Figure 7:
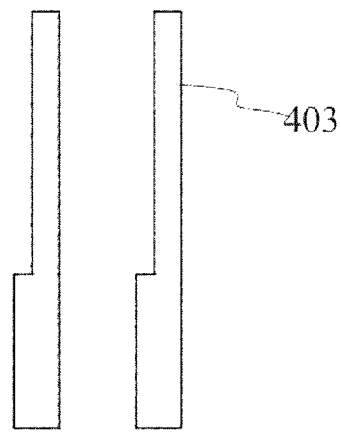
FIG. 7 is a structural plan view of an array substrate, after completion of the manufacture of connection lines.

Below, in connection with the accompanying drawings, the manufacturing method of an array substrate provided by the embodiment of the invention will be described in detail; with the array substrate having a structure as illustrated in FIG. 2 as an example, the manufacturing method may comprise steps as follows:

First step: with reference to FIG. 7, a metal layer of molybdenum (Mo), aluminum (Al) or chromium (Cr), and the like is deposited on a glass substrate, and then by using a patterning process, gate electrodes (not shown) of the array substrate, gate scanning lines, and connection lines 403 are formed, and the connection lines 403 have a cross-section of narrow top and wide bottom; the coverage of the connection lines 403 and the coverage of the gate scanning lines do not overlap with each other, and moreover, the wiring directions of the connection lines 403 and of the gate scanning lines are mutually perpendicular.

Second step, a layer of silicon nitride ($SiN_x$) or silicon oxide ($SiO_x$) is deposited on the gate electrodes of the array substrate, the gate scanning lines and the connection lines, and then by using a patterning process, a gate-insulating layer is formed.

Figure 8:
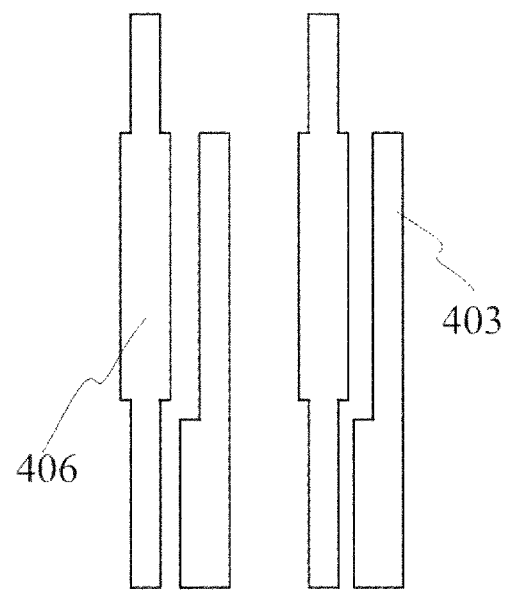
FIG. 8 is a structural plan view of the array substrate, after completion of the manufacture of data lines.

Third step, with reference to FIG. 8, on the gate-insulating layer, a semiconductor thin film, an impurity-doped semiconductor thin film and a source-drain metal thin film are sequentially deposited, and then, on the gate-insulating layer, by using half tone mask technology, an active layer, source electrodes (not shown) of the array substrate, drain electrodes (not shown) of the array substrate, and data lines 406 are formed.

Figure 9:
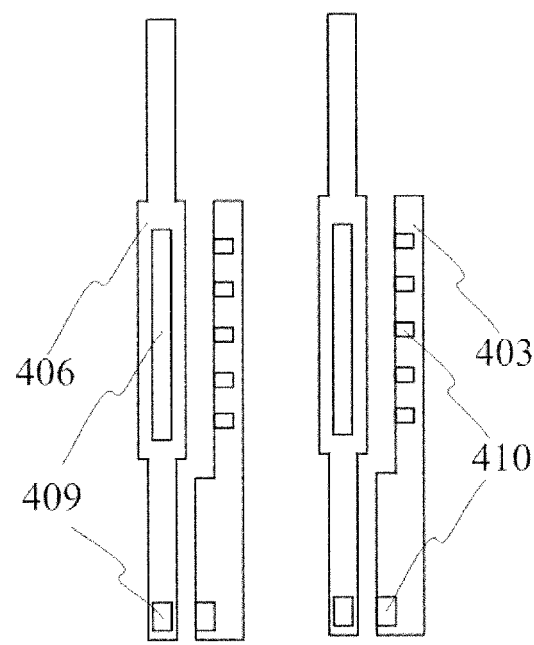
FIG. 9 is a structural plan view of the array substrate, after completion of the manufacture of a first-type via-hole and a second-type via-hole.

Fourth step, with reference to FIG. 9, above the active layer and the source electrodes and drain electrodes, a silicon nitride thin film is deposited to form a passivation layer; moreover, after processes of photoresist-coating, exposing and developing as well as etching and stripping-off, etc., a first-type via-hole 409 penetrating the passivation layer, and a second-type via-hole 410 penetrating the passivation layer, the active layer and the gate-insulating layer are formed.

Figure 10:
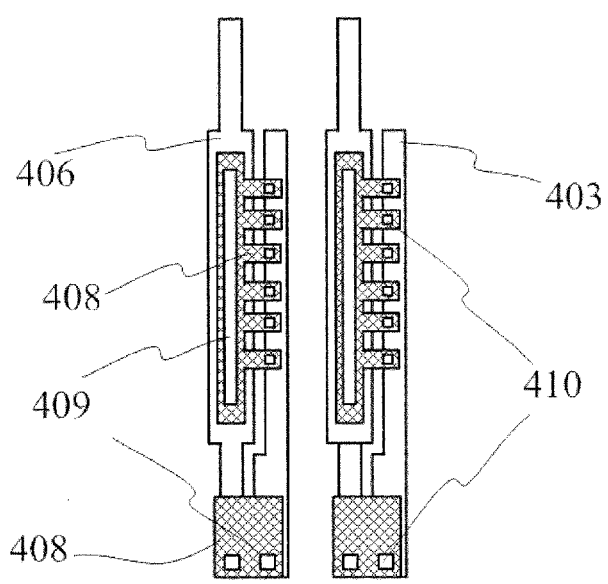
FIG. 10 is a schematic structural plan view of the array substrate, after completion of the manufacture of a bridge structure.

Fifth step, with reference to FIG. 10, on the passivation layer 36, by using a magnetron sputtering method, an indium-tin oxide (ITO) transparent electrically conductive thin-film layer is deposited, and after processes of photoresist-coating, exposing and developing as well as wet-etching and stripping-off, pixel electrodes (not shown) and a bridge structure 408 are formed; the bridge structure is connected with a data line 406 through the first-type via-hole 409, and at the same time the bridge structure is connected with a connection line 403 through the second-type via-hole 410; the pixel electrodes are directly connected with the drain electrodes of the array substrate through third-type via-holes (not shown) located in the passivation layer.

After the above-described steps, the array substrate provided by the embodiment of the invention having a structure as illustrated in FIG. 2 can be manufactured. In the array substrate formed by the above-described method, connection lines are provided; a connection line is connected with a data line, through the bridge structure in the LED region and in a region under a scribe line of a counter substrate, so that, when breakage occurs to a data line located between the LED region and the scribe line of the counter substrate, the image data signals over the data line can be transmitted from one end of the breakpoint through a connection line to the other end of the breakpoint, which ensures the normal transmission of the image data signals and effectively solves the problem of defective display caused by breakage of the data lines, thereby improving the display effect of the liquid crystal display device, and improving the user experience.

An embodiment of the invention provides a display panel, and the display panel comprises an array substrate as described above.

In summary, the embodiments of the invention provide an array substrate, a manufacturing method thereof and a display panel. In the array substrate, a bridge structure and a connection line corresponding to each data line are provided; the connection line connects the data line located in an LED region and in a region under a scribe line of a counter substrate, so that, when breakage occurs to the data line located between an LED region and a scribe line of a counter substrate, the signals over the data line still can be normally transmitted; meanwhile, because the connection line is located between the base substrate and the gate-insulating layer and is covered by a multi-layer structure, the multi-layer structure can provide protection to the connection line during a subsequent cutting process, so that, the connection line will not be broken during transferring and breaking. The array substrate effectively solves the problem of defective display caused by breakage of the data lines, thereby improving the display effect of the liquid crystal display device, and improving the user experience.

Apparently, various alterations and modifications can be made by the skilled in the art to the invention, without departing from the spirit and scope of the invention. Therefore, so far as these alterations and modifications fall in the scope of the claims and their equivalents of the invention, these alterations and modifications are intended to be encompassed by the invention.

The invention claimed is:

1. An array substrate, comprising: a base substrate, gate scanning lines located on the base substrate, a gate-insulating layer located on the gate scanning lines, an active layer located on the gate-insulating layer, data lines located on the active layer, a passivation layer located over the data lines, pixel electrodes located on the passivation layer; wherein the array substrate further comprises: a bridge structure and a connection line corresponding to each data line; and wherein the bridge structure is located on the passivation layer and is provided in a same layer as the pixel electrodes; and each connection line is located on the base substrate, and each connection line is connected with the data line, through the bridge structure in an LED region and in a region under a scribe line of a counter substrate, wherein the bridge structure is contacted with the connection line and the data line, respectively.

2. The array substrate according to claim 1, wherein the connection line and the gate scanning lines are provided in a same layer but not intersect.

3. The array substrate according to claim 2, wherein the connection line and the gate scanning lines are mutually perpendicular.

4. The array substrate according to claim 2, wherein the bridge structure is connected with the data line, through a first-type via-hole which penetrates the passivation layer and is located over the data line.

5. The array substrate according to claim 2, wherein the bridge structure is connected with the connection line, through a second-type via-hole which penetrates the passivation layer, the active layer and the gate-insulating layer, and is located over the connection line.

6. The array substrate according to claim 1, wherein the connection line and the gate scanning lines are mutually perpendicular.

7. The array substrate according to claim 1, wherein the connection line and the gate scanning lines are manufactured from a same material.

8. The array substrate according to claim 1, wherein coverage of the connection line and coverage of the data line do not overlap.

9. The array substrate according to claim 1, wherein the bridge structure is connected with the data line, through a first-type via-hole which penetrates the passivation layer and is located over the data line.

10. The array substrate according to claim 9, wherein the bridge structure is connected with the connection line, through a second-type via-hole which penetrates the passivation layer, the active layer and the gate-insulating layer, and is located over the connection line.

11. The array substrate according to claim 1, wherein the bridge structure is connected with the connection line, through a second-type via-hole which penetrates the passivation layer, the active layer and the gate-insulating layer, and is located over the connection line.

12. A display panel, comprising an array substrate in accordance with claim 1.

13. A manufacturing method of an array substrate, comprising steps as follows: forming gate scanning lines on a base substrate; forming a gate-insulating layer on the gate scanning lines; forming an active layer on the gate-insulating layer; forming data lines on the active layer; forming a passivation layer on the data lines; and forming pixel electrodes on the passivation layer; wherein the method further comprises steps as follows:

forming a connection line corresponding to each data line above the base substrate, and the connection line being connected with the data line, through a bridge structure in an LED region and in a region under a scribe line of a counter substrate, wherein the bridge structure is contacting with the connection line and the data line, respectively; and forming a bridge structure on the passivation layer, and the bridge structure being provided in a same layer as the pixel electrodes.

14. The manufacturing method according to claim 13, wherein the connection line and the gate scanning lines are provided in a same layer but not intersect.

15. The manufacturing method according to claim 13, wherein the connection line and the gate scanning lines are mutually perpendicular.

16. The manufacturing method according to claim 13, wherein the connection line and the gate scanning lines are manufactured from a same material.

17. The manufacturing method according to claim 13, wherein coverage of the connection line and coverage of the data line do not overlap.

18. The manufacturing method according to claim 13, wherein the bridge structure is connected with the data line, through a first-type via-hole which penetrates the passivation layer and is located over the data line.

19. The manufacturing method according to claim 13, wherein the bridge structure is connected with the connection line, through a second-type via-hole which penetrates the passivation layer, the active layer and the gate-insulating layer, and is located over the connection line.

20. The manufacturing method according to claim 19, wherein the bridge structure is connected with the connection line, through a second-type via-hole which penetrates the passivation layer, the active layer and the gate-insulating layer, and is located over the connection line.

* * * * *